(12) United States Patent
Lu et al.

(10) Patent No.: US 10,645,848 B1
(45) Date of Patent: May 5, 2020

(54) CONTAINER STRUCTURE WITH BUILTIN HEATSINK FOR HOUSING A SENSOR UNIT OF AN AUTONOMOUS DRIVING VEHICLE

(71) Applicant: Baidu USA LLC, Sunnyvale, CA (US)

(72) Inventors: Weiyu Lu, Sunnyvale, CA (US); Fu-Kang Liao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/168,932

(22) Filed: Oct. 24, 2018

(51) Int. Cl.
| | |
|---|---|
| *B42D 25/337* | (2014.01) |
| *H04N 1/44* | (2006.01) |
| *B41M 3/14* | (2006.01) |
| *B42D 25/41* | (2014.01) |
| *H04N 1/405* | (2006.01) |
| *B42D 25/435* | (2014.01) |
| *B42D 25/324* | (2014.01) |
| *H05K 7/20* | (2006.01) |
| *G01C 21/36* | (2006.01) |
| *G01S 13/931* | (2020.01) |
| *G01S 17/93* | (2020.01) |
| *B60R 11/04* | (2006.01) |

(52) U.S. Cl.
CPC .......... *H05K 7/20854* (2013.01); *B60R 11/04* (2013.01); *G01C 21/3682* (2013.01); *G01S 13/931* (2013.01); *G01S 17/936* (2013.01)

(58) Field of Classification Search
CPC ............. H05K 7/20854; B60R 11/04; G01C 21/3682; G01S 13/931; G01S 17/936
USPC ........................................................ 361/709
See application file for complete search history.

(56) References Cited

U.S. PATENT DOCUMENTS

| | | | |
|---|---|---|---|
| 7,031,142 B2* | 4/2006 | Mishima | B60R 1/00 348/E5.027 |
| 7,420,811 B2* | 9/2008 | Chan | F21V 29/004 361/707 |
| 8,004,844 B2* | 8/2011 | Kim | H05K 7/20163 361/716 |
| 8,059,409 B2* | 11/2011 | Steenwyk | H05K 7/20545 361/697 |
| 9,651,458 B2* | 5/2017 | Moore | G01S 17/936 |
| 2004/0090117 A1* | 5/2004 | Dudeck | B60T 7/22 303/191 |
| 2016/0131494 A1* | 5/2016 | Lee | G01C 21/3605 701/25 |
| 2017/0176989 A1* | 6/2017 | Hay | B60T 7/12 |

* cited by examiner

*Primary Examiner* — Anatoly Vortman
(74) *Attorney, Agent, or Firm* — Womble Bond Dickinson (US) LLP

(57) ABSTRACT

A sensor unit utilized in an autonomous driving vehicle (ADV) includes a unit tray containing a sensor interface, a host interface, and one or more sensor processing modules. The sensor interface can be coupled to a variety of sensors used in the ADV, such as, for example, LIDAR, RADAR, cameras, etc., which may be mounted on different locations of the ADV. The host interface can be coupled a host system that is responsible for autonomously driving the vehicle. The host system is configured to perceive a driving environment surrounding the ADV base on sensor data obtained from the sensors and plan a path to autonomously drive the vehicle through the driving environment. The sensor processing modules are configured to process the sensor data obtained from the sensors.

20 Claims, 12 Drawing Sheets

CONTAINER STRUCTURE WITH BUILTIN HEATSINK FOR HOUSING A SENSOR UNIT OF AN AUTONOMOUS DRIVING VEHICLE

TECHNICAL FIELD

Embodiments of the present disclosure relate generally to autonomous DRIVING vehicles. More particularly, embodiments of the disclosure relate to a sensor system of an autonomous driving vehicle.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. The accuracy and efficiency of the motion planning and control depends heavily on the sensors of the vehicle. Different sensors may have different requirements or specifications. Typically, an autonomous vehicle has a centralized computing chassis that connects to all sensors and actuators on a car. A sensor unit is utilized to connect a host system to the sensors. The sensor unit typically includes one or more sensor processing modules. These sensor processing modules can generate significant heat. It is challenging to design a container of the sensor unit to efficiently remove the heat from the sensor unit.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
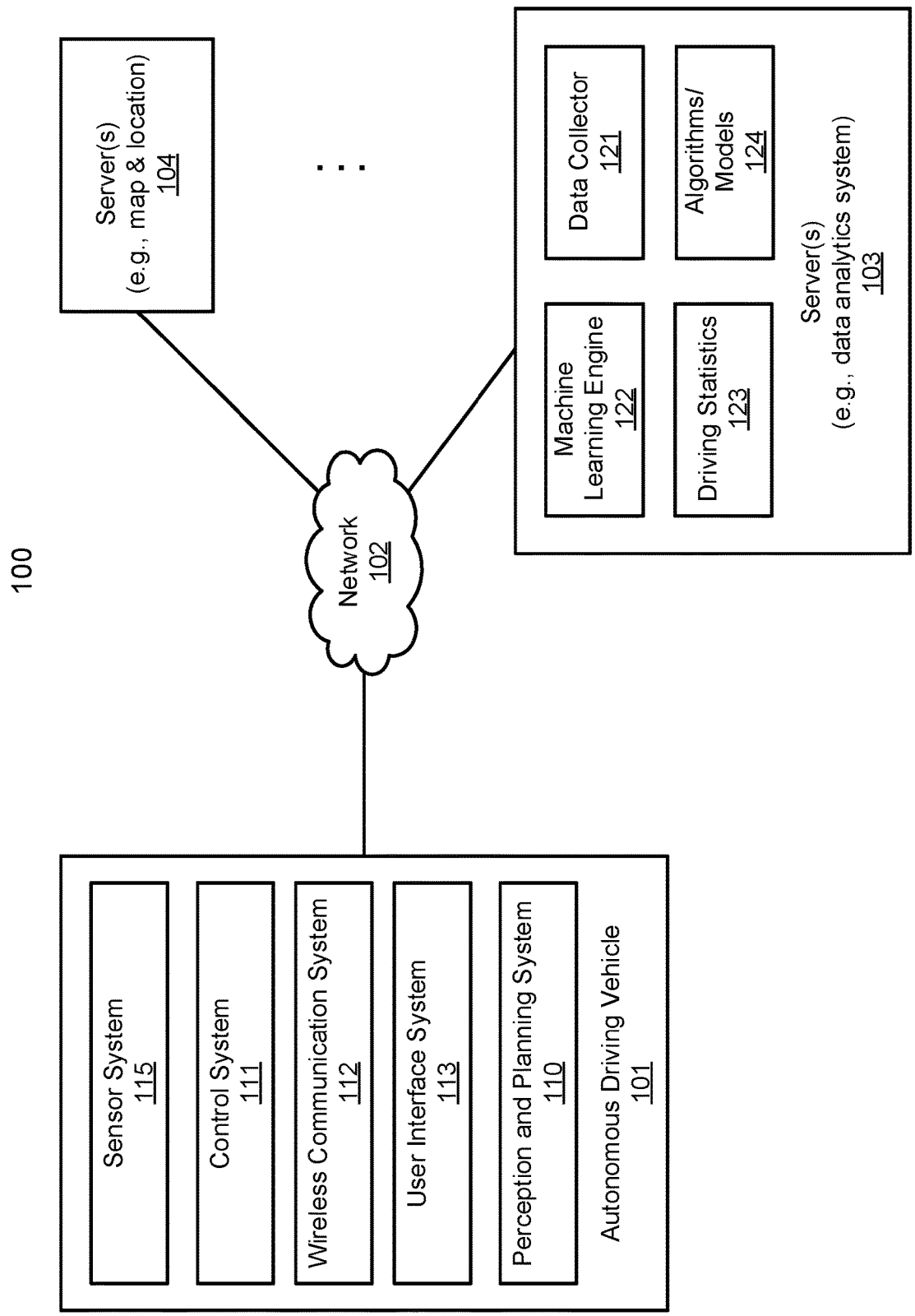
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to one aspect, a sensor unit utilized in an autonomous driving vehicle (ADV) includes a unit tray containing a sensor interface, a host interface, and one or more sensor processing modules. The sensor interface can be coupled to a variety of sensors used in the ADV, such as, for example, LIDAR, RADAR, cameras, etc., which may be mounted on different locations of the ADV. The host interface can be coupled a host system that is responsible for autonomously driving the vehicle. The host system is configured to perceive a driving environment surrounding the ADV base on sensor data obtained from the sensors and plan a path to autonomously drive the vehicle through the driving environment. The sensor processing modules are configured to process the sensor data obtained from the sensors.

The sensor unit further includes a unit base plate (e.g., a bottom portion) and a unit cover (e.g., a top portion) to form a container to house the unit tray therein. The unit cover includes a number of fins disposed on an external surface of the unit cover to form a built-in heat sink integrated with the unit cover. The integrated heatsink is to receive the heat generated from the sensor unit tray (e.g., sensor processing modules) and to radiate the heat to the ambient environment without having to use a cooling fan. The unit cover is made from heat conductive material.

In one embodiment, the sensor unit cover further includes a first set of one or more heat transfer arms or beams disposed on an internal surface of the unit cover. The heat transfer arms extend downwardly from the internal surface to receive the heat generated from the heat generating components and to transfer the heat to the fins of the unit cover on the external surface. Specifically, when the unit cover is lowered down to cover the unit tray, the heat transfer arms are positioned to substantially contact the external surfaces of the heat generating components, such as the sensor processing modules or memory, of the unit tray. The heat transfer arms can receive at least a portion of the heat via direct contact and transfer the heat to the fins on the external surface, which in turns radiate the heat to the ambient environment. In one embodiment, the heat transfer arms are disposed on the internal surface of the unit cover directly underneath the fins on the external surface of the unit cover.

According to another embodiment, the base plate includes a second set of one or more heat transfer arms disposed on the top surface of the base plate, i.e., the surface that faces the unit tray. The heat transfer arms of the second set extend upwardly from the top surface The unit tray includes a printed circuit board (PCB) that allow some components to be mounted or soldered on the top side of the PCB and the bottom side of the PCB. When the unit tray is deposited on the unit base plate, the heat transfer arms of the second set substantially contact an external surface of the heat generating components disposed on the bottom surface of the PCB to receive and transfer the heat to the base plate.

According to one embodiment, the unit tray further includes a first mounting plate and a second mounting plate mounted on a first side and a second side opposite to the first side of the PCB to form a tray. The sensor processing modules may be mounted on both the top side and bottom side of the PCB. An array of sensor connectors may be mounted on an edge of the first side and the second side of the PCB. The sensor connectors may be utilized to connect the components of the unit tray to the sensors, for example, via cables. In one embodiment, the first mounting plate and the second mounting plate are perpendicularly mounted to the edges of the PCB. That is, the surface planes of the mounting plates are parallel to each other, but are perpendicular to the surface plane of the PCB, forming a U-shape tray.

In one embodiment, each of the mounting plates includes one or more openings to allow at least some of the sensor connectors to be exposed to external to the sensor unit cover to couple with the sensors. The unit cover is molded into a single piece with the fins as a part of built-in heat sink. The unit cover is further molded into a reversed U-shape to complement the U-shape of the unit tray when the unit cover covers the unit tray.

According to another aspect, an autonomous driving system includes a number of sensors mounted on various locations of an ADV and a host system. The host system includes a perception module and a planning and control module, wherein the perception module is to perceive a driving environment surrounding the ADV based on sensor data obtained from the sensors, and wherein the planning and control module is to plan a path to autonomously drive the ADV. The autonomous driving system further includes a sensor unit coupled to the plurality of sensors and the host system as described above.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) severs, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, infotainment system 114, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
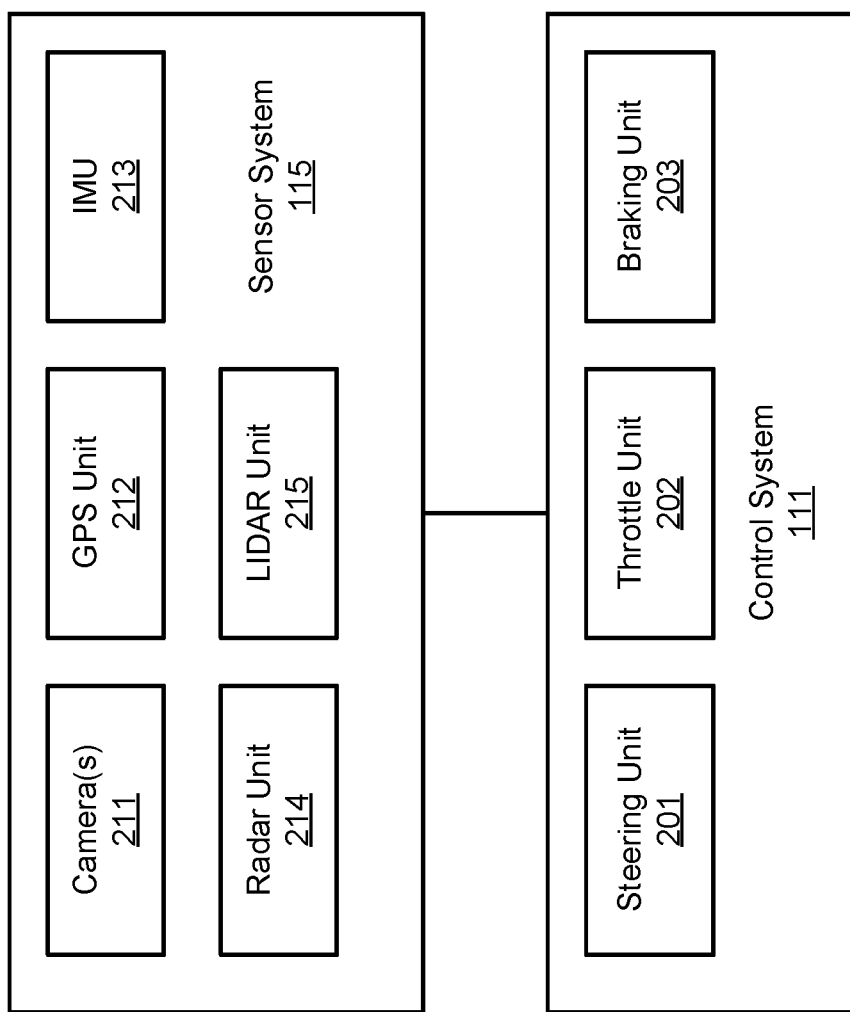
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. In one embodiment, algorithms 124 may include rules or algorithms for perception, prediction, decision, planning, and/or control processes, which will be described in details further below. Algorithms 124 can then be uploaded on ADVs to be utilized during autonomous driving in real-time.

Figure 3:
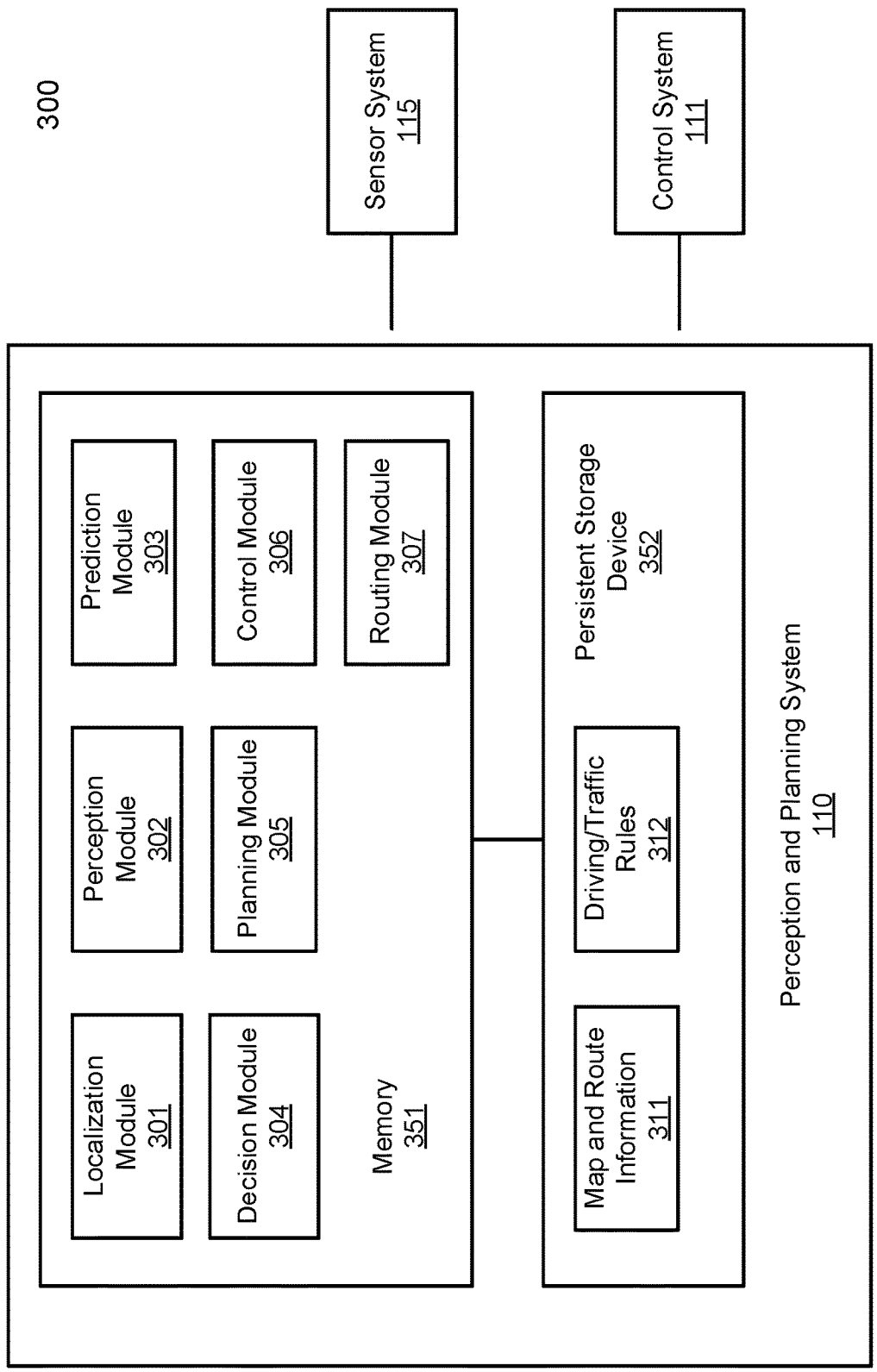
FIG. 3 are block diagrams illustrating an example of a perception and planning system used with an autonomous vehicle according to one embodiment.

FIG. 3 are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIG. 3, perception and planning system 110 includes, but is not limited to, localization module 301, perception module 302, prediction module 303, decision module 304, planning module 305, control module 306, and routing module 307.

Some or all of modules 301-307 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-307 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Figure 4:
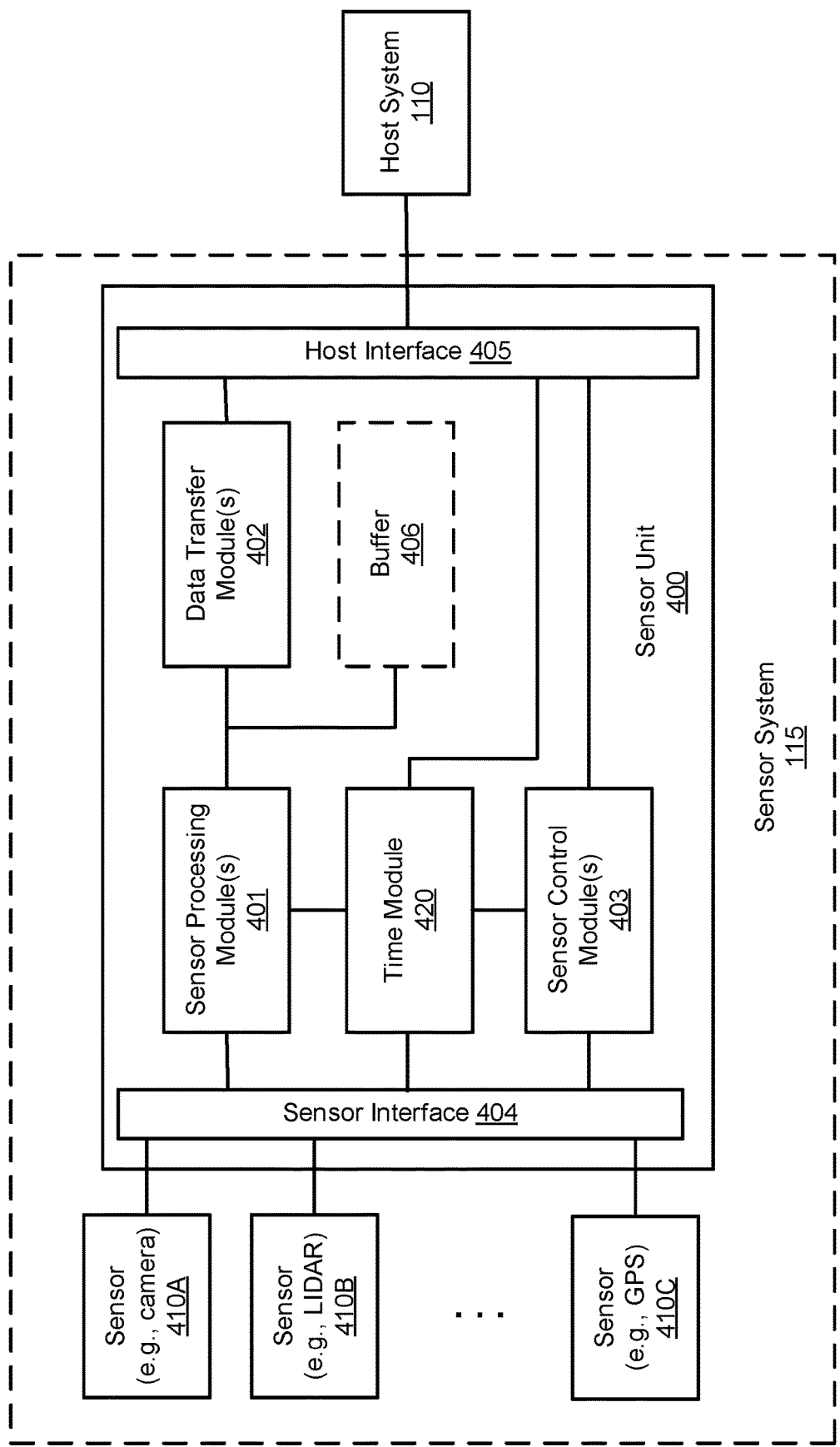
FIG. 4 is a block diagram illustrating an example of a sensor unit according to one embodiment.

FIG. 4 is a block diagram illustrating an example of a sensor system according to one embodiment of the invention. Referring to FIG. 4, sensor system 115 includes a number of sensors 410 and a sensor unit 400 coupled to host system 110. Host system 110 represents a planning and control system as described above, which may include at least some of the modules as shown in FIG. 3. Sensor unit 400 may be implemented in a form of an FPGA device or an ASIC (application specific integrated circuit) device. In one embodiment, sensor unit 400 includes, amongst others, one or more sensor data processing modules 401 (also simply referred to as sensor processing modules), data transfer modules 402, sensor control modules or logic 403, and time module 420. Modules 401-403 and 420 can communicate with sensors 410A-410C (collectively referred to as sensors 410) via a sensor interface 404 and communicate with host system 110 via host interface 405. Optionally, an internal or external buffer 406 may be utilized for buffering the data for processing.

In one embodiment, for the receiving path or upstream direction, sensor processing module 401 is configured to receive sensor data from a sensor via sensor interface 404 and process the sensor data (e.g., format conversion, error checking), which may be temporarily stored in buffer 406. Data transfer module 402 is configured to transfer the processed data to host system 110 using a communication protocol compatible with host interface 405. Similarly, for the transmitting path or downstream direction, data transfer module 402 is configured to receive data or commands from host system 110. The data is then processed by sensor processing module 401 to a format that is compatible with the corresponding sensor. The processed data is then transmitted to the sensor.

In one embodiment, sensor control module or logic 403 is configured to control certain operations of sensors 410, such as, for example, timing of activation of capturing sensor data, in response to commands received from host system (e.g., perception module 302) via host interface 405. Host system 110 can configure sensors 410 to capture sensor data in a collaborative and/or synchronized manner, such that the sensor data can be utilized to perceive a driving environment surrounding the vehicle at any point in time.

In one embodiment, time module 420 is configured to generate timestamps for the sensor processing module 401 and the sensor control module 403, referred to as receiving timestamps and transmitting timestamps. The receiving timestamps are utilized by the sensor processing module 401 to process the sensor data received from the sensors in a controlled timing manner. Similarly, the transmitting timestamps are utilized by the sensor control module 403 to control the sensors in a controlled timing manner. The transmitting timestamps and the receiving timestamps allow the system to synchronize in time the control commands issued to the sensors and the sensor data captured and received from the sensors in response to the control commands. The time module 420 is configured generate time based on GPS signals received from a GPS sensor or pulse per second (PPS) and GPRMC signals received from a GNSS received via the sensor interface. When the GPS or the PPSGPRMC signals are unavailable, the time module 420 is configured to derive time from other time sources (e.g., host system or a remote device over a network).

Sensor interface 404 can include one or more of Ethernet, USB (universal serial bus), LTE (long term evolution) or cellular, WiFi, GPS, camera, CAN, serial (e.g., universal asynchronous receiver transmitter or UART), SIM (subscriber identification module) card, and other general purpose input/output (GPIO) interfaces. Host interface 405 may be any high speed or high bandwidth interface such as PCIe (peripheral component interconnect or PCI express) interface. Sensors 410 can include a variety of sensors that are utilized in an autonomous driving vehicle, such as, for example, a camera, a LIDAR device, a RADAR device, a GPS receiver, an IMU, an ultrasonic sensor, a GNSS (global navigation satellite system) receiver, an LTE or cellular SIM card, vehicle sensors (e.g., throttle, brake, steering sensors), and system sensors (e.g., temperature, humidity, pressure sensors), etc.

For example, a camera can be coupled via an Ethernet or a GPIO interface. A GPS sensor can be coupled via a USB or a specific GPS interface. Vehicle sensors can be coupled via a CAN interface. A RADAR sensor or an ultrasonic sensor can be coupled via a GPIO interface. A LIDAR device can be coupled via an Ethernet interface. An external SIM module can be coupled via an LTE interface. Similarly, an internal SIM module can be inserted onto a SIM socket of sensor unit 400. The serial interface such as UART can be coupled with a console system for debug purposes.

Note that sensors 410 can be any kind of sensors and provided by various vendors or suppliers. Sensor processing module 401 is configured to handle different types of sensors and their respective data formats and communication protocols. According to one embodiment, each of sensors 410 is associated with a specific channel for processing sensor data and transferring the processed sensor data between host system 110 and the corresponding sensor. Each channel includes a specific sensor processing module and a specific data transfer module that have been configured or programmed to handle the corresponding sensor data and protocol.

Figure 5A:
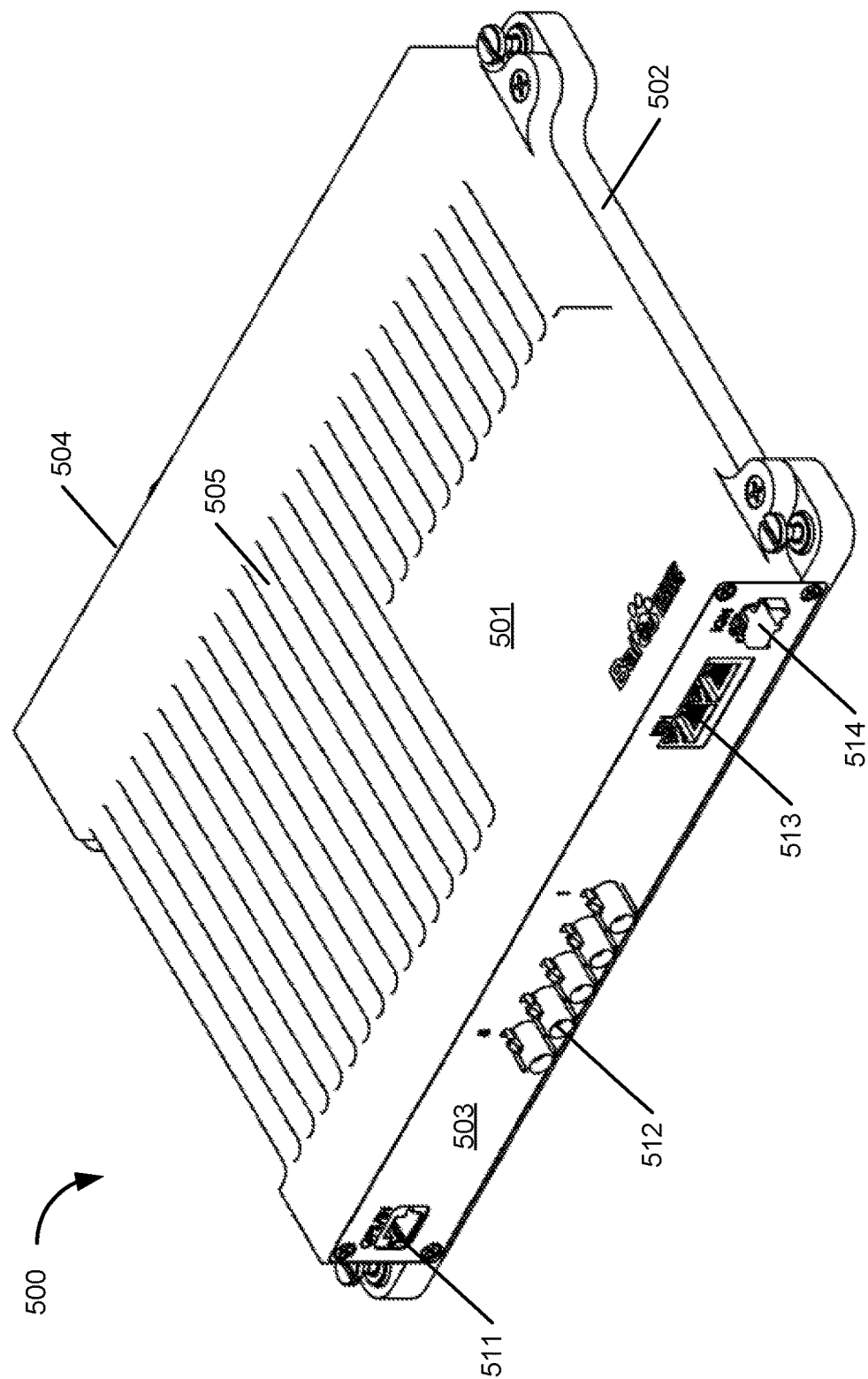
FIGS. 5A and 5B show a perspective view of a sensor unit according to one embodiment.
Figure 5B:
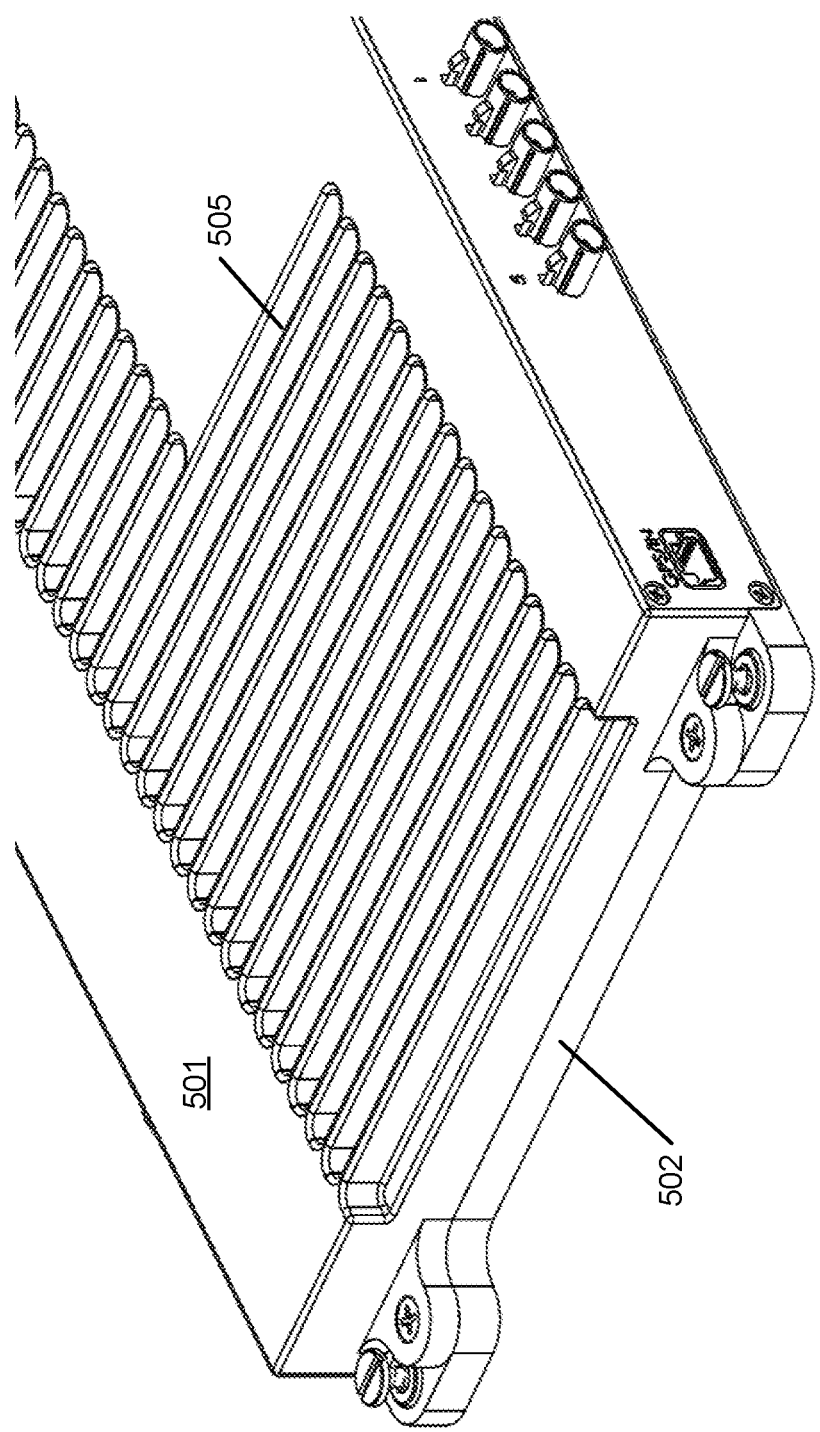

FIGS. 5A and 5B show perspective view of a sensor unit according to one embodiment. Sensor unit 500 may represent sensor unit 400 of FIG. 4. Referring to FIGS. 5A and 5B, sensor unit 500 includes unit cover 501 and base plate 502 to house a unit tray therein, where the unit tray includes a first mounting plate 503 and a second mounting plate 504 (not shown) to expose sensor connectors of sensor unit 500 to be coupled to a variety of sensors. The sensor interface may include, for example, GPS sensor interface 511, camera interface 512, Ethernet interface 513, as well as the ignition connector 514 coupled to the ignition of the vehicle for power on and power off. In one embodiment, an external surface of unit cover 501 includes an array of fins 505 integrated therein to form a heatsink to radiate the heat generated from the sensor unit. The heatsink is molded as a part of unit cover 501 as a built-in heatsink.

Figure 6A:
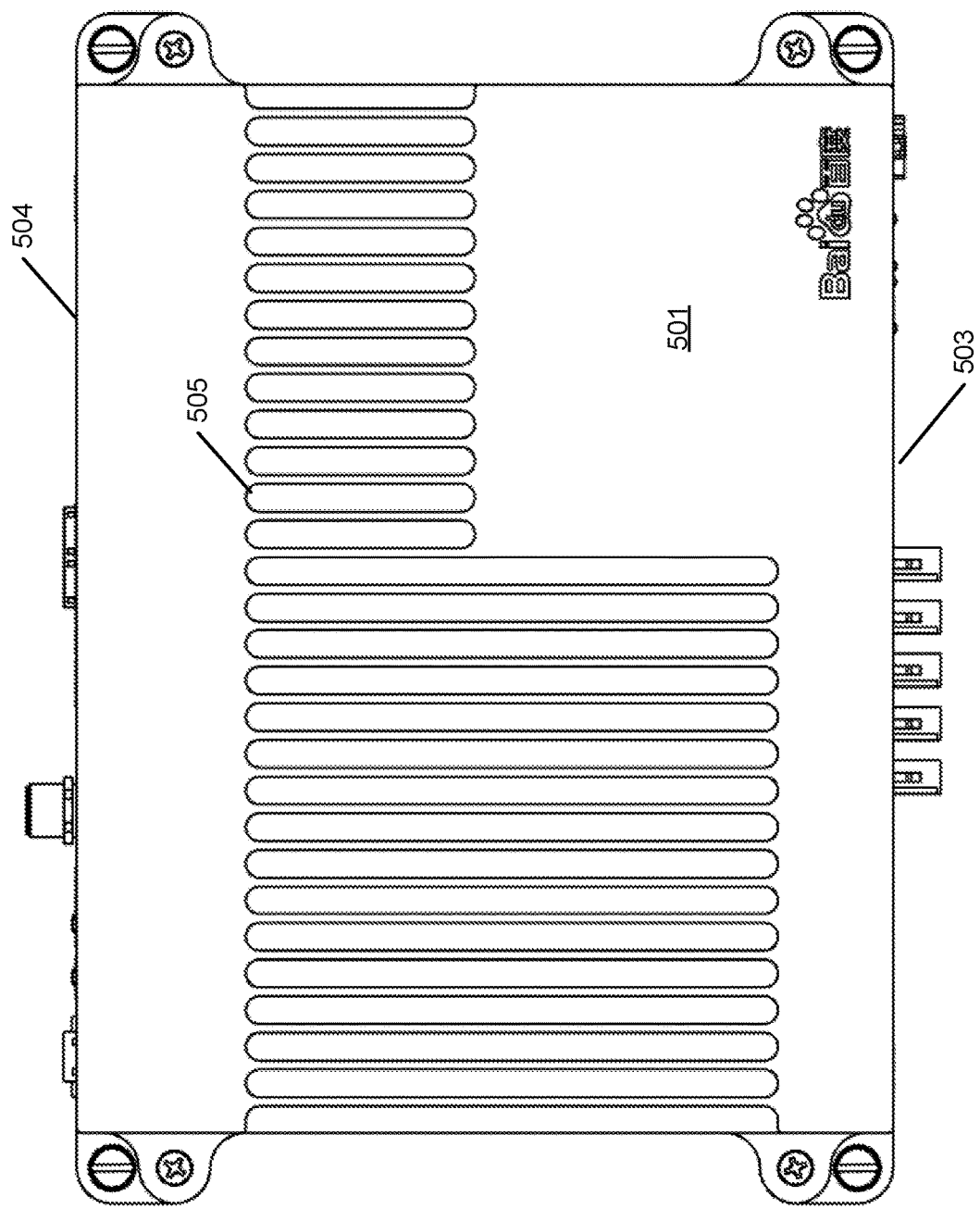
FIGS. 6A-6D show a top view, side views, and a bottom view of a sensor unit respectively according to one embodiment.
Figure 6B:
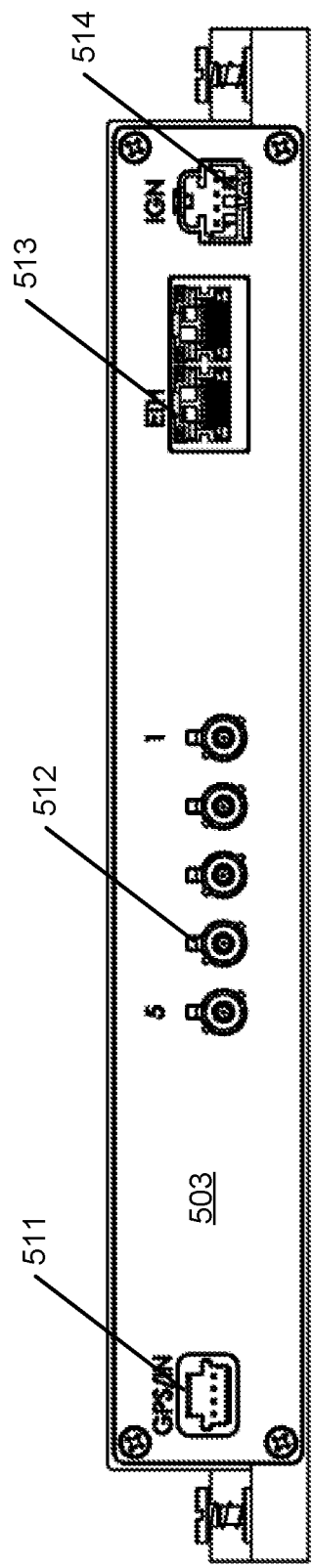
Figure 6C:
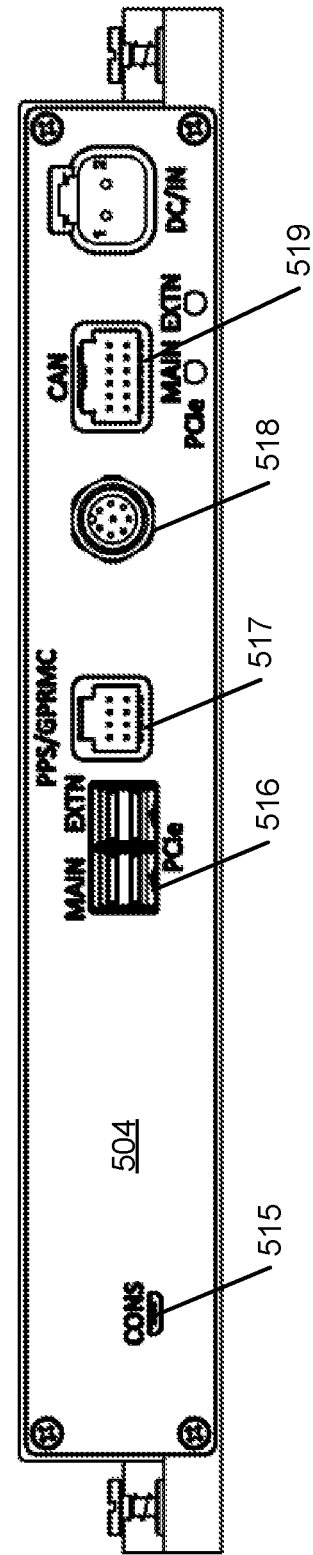
Figure 6D:
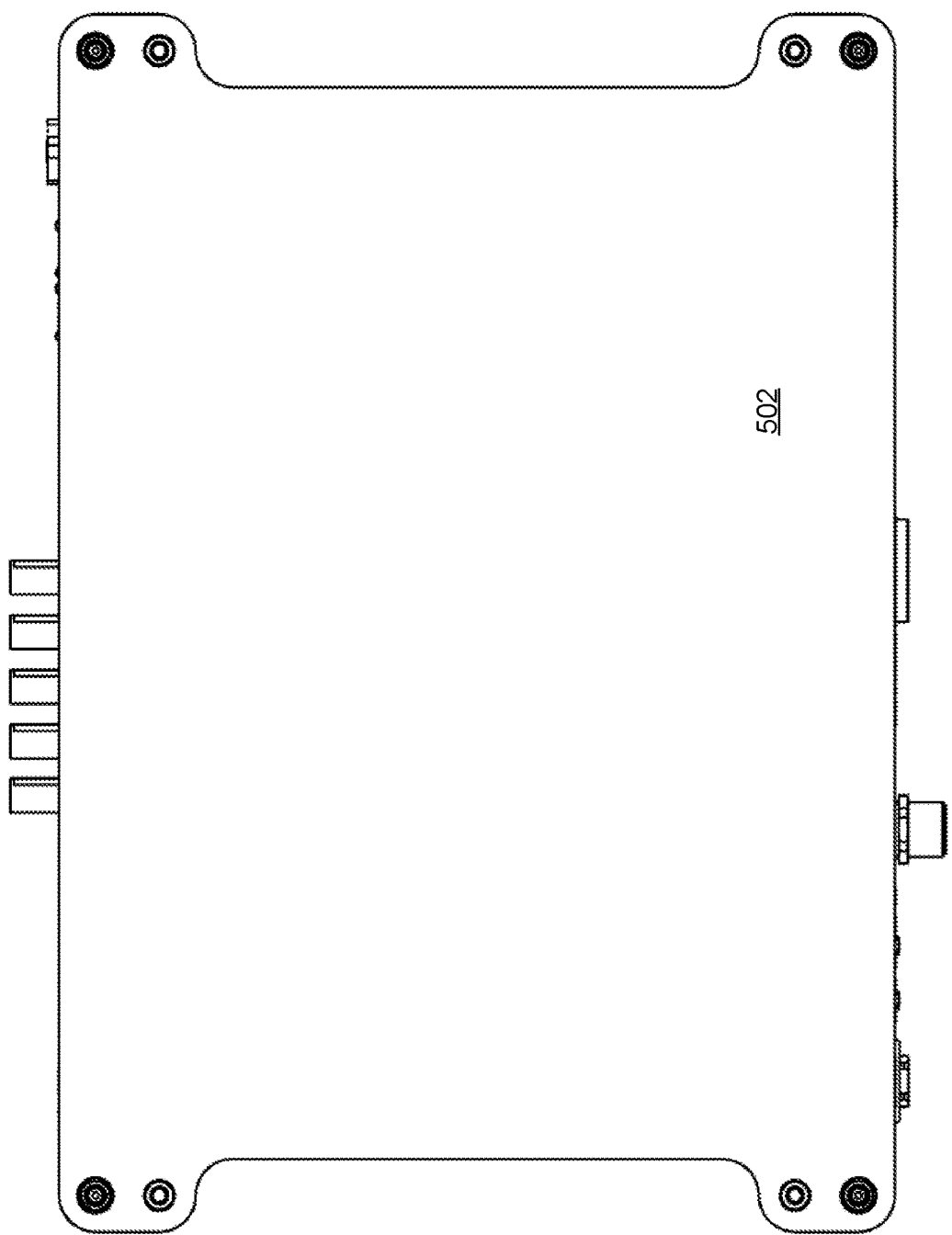

FIG. 6A shows a top view of the sensor unit. FIGS. 6B and 6C show side views of the sensor unit. FIG. 6D shows a bottom view of the sensor unit. Referring to FIG. 6C, on this side 504, an array of sensor connectors are disposed, including USB connector 515, PPS/GPRMC connector 517, LIDAR connector 518, and CAN connector 519. In addition, a host interface, in this example, PCIe connector(s) 516, can be utilized to couple the sensor unit to planning and control system 110.

Figure 7:
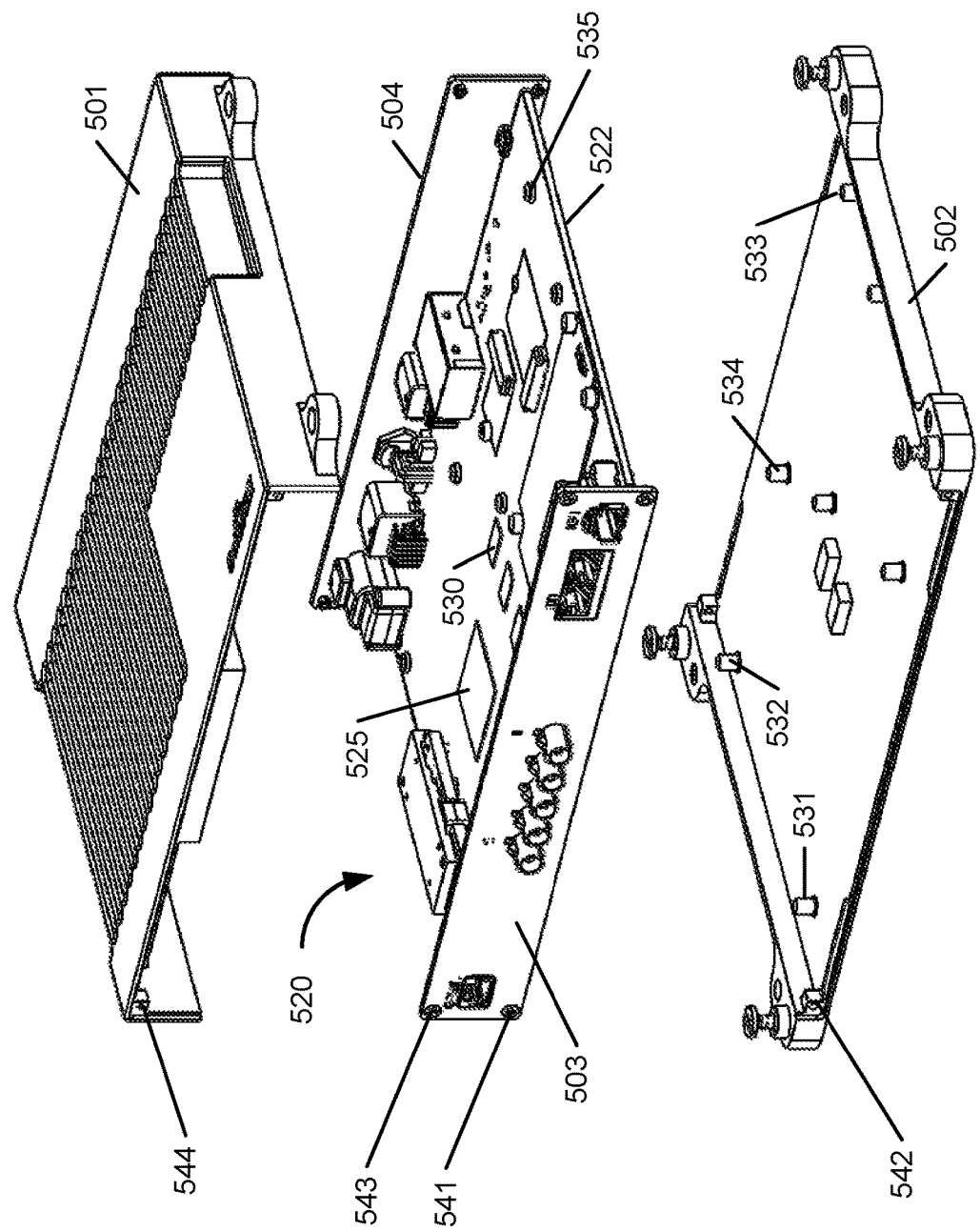
FIG. 7 shows an exploded view of a sensor unit according to one embodiment.

FIG. 7 shows an exploded view of a sensor unit according to one embodiment. Referring to FIG. 7, a sensor unit includes unit cover 501 and base plate 502 forming a sensor unit container to contain unit tray 520 therein. In one embodiment, tray unit 520 includes a PCB 522 having the sensor processing components soldered thereon, such as, for example, sensor processing module or processor 525 and memory 530. Sensor processing module 525 can be implemented in a variety of form factors including an FPGA or ASIC, etc. The sensor processing components can be soldered or attached on both sides of PCB 522. Mounting plate 503 is attached or mounted to a first side of PCB 522 and mounting plate 504 is attached to or mounted to a second side of PCB 522, which is opposite to the first side. The mounting plates 503 and 504 are perpendicularly mounted onto the edges of PCB 522. That is, the surface planes of mounting plates of mounting plates 503-504 are perpendicular to the surface plane of PCB 522, while the surface planes of mounting 503-504 are parallel to each other.

The unit tray 520 can then be deposited onto base plate 502. PCB 522 can sit on top and be supported by a number of stands such as stands 531-534. PCB 522 can further be fixedly mounted on the stands using a screw through a hole of PCB 522, such as screw hole 535. The unit tray 520 can then mounted to unit cover 501 and base plate 502, for example, using screw 541 screwed onto a threaded nut 542 and using screw 543 onto threaded nut 544.

Figure 8:
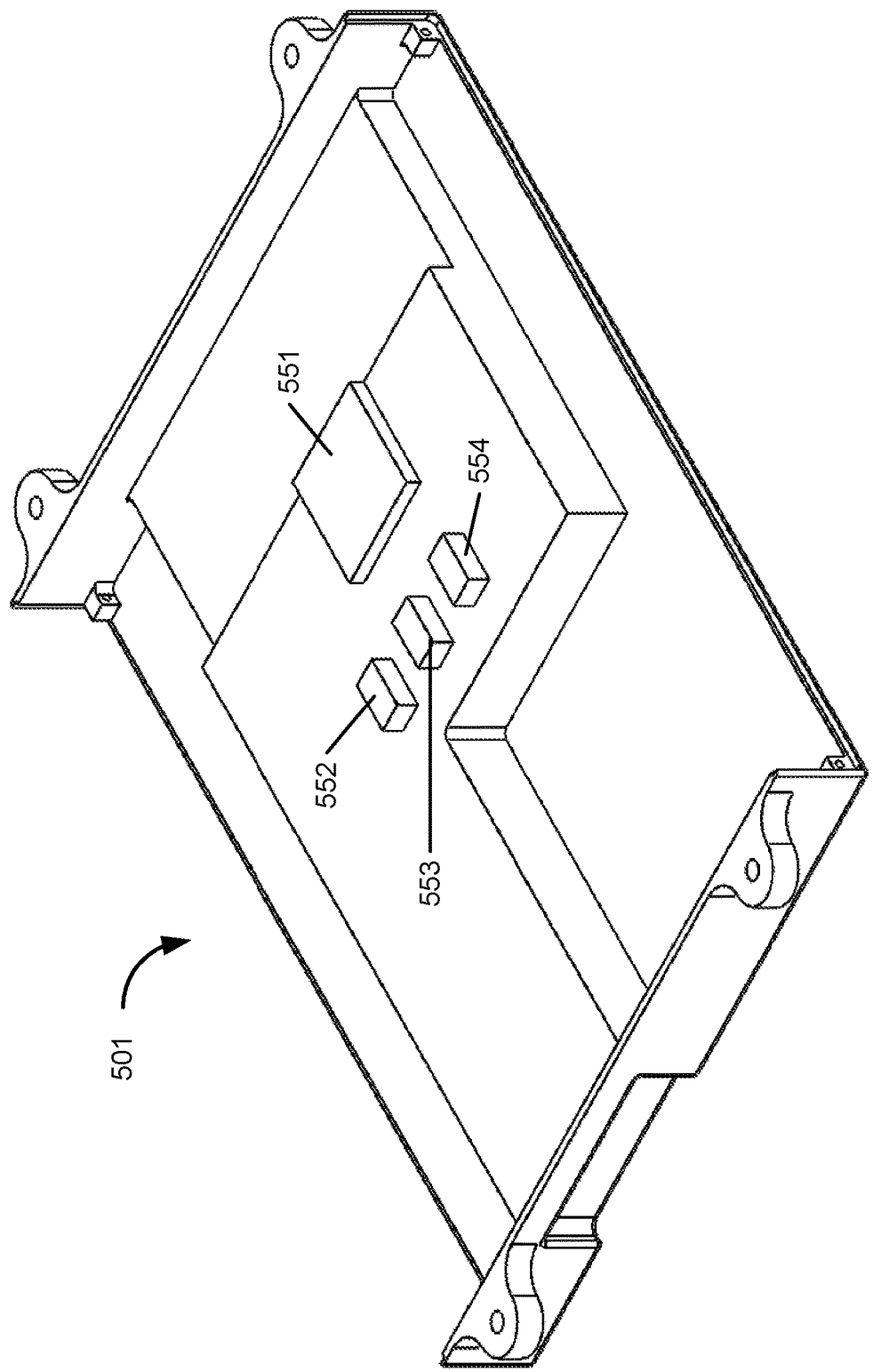
FIG. 8 shows an internal surface of a unit cover of a sensor unit according to one embodiment.

FIG. 8 shows an internal surface of a unit cover according to one embodiment. Referring to FIG. 8, in one embodiment, one or more heat transfer arms 551-554 are disposed on the internal surface of unit cover 501. The heat transfer arms 551-554 are positioned extending to downwardly to receive the heat generated from the sensor processing components of the sensor unit such as processing module 525 and memory chip 530. When unit cover 501 is lowered to cover unit tray 520, the heat transfer arms 551-554 substantially contact the corresponding heat generating components (e.g., sensor processing components) to receive the heat generated from the heat generating components and to transfer the heat to the unit cover 501. The heat can then be transferred to the fins 505 disposed on the external surface of unit cover 501 and radiated to the ambient environment, without having to use a cooling fan. In one embodiment, the heat transfer arms 551-554 are disposed on directly underneath the fins 505 of the external surface, such that the heat can be transferred to the fins 505 quickly. The internal surface of unit cover 501 is molded into a specific shape (e.g., uneven surface) to accommodate the size and dimension of the components of unit tray 520, while maximizing the heat dissipation surface of the unit cover 502 by configuring more fins 505 on the external surface.

Figure 9:
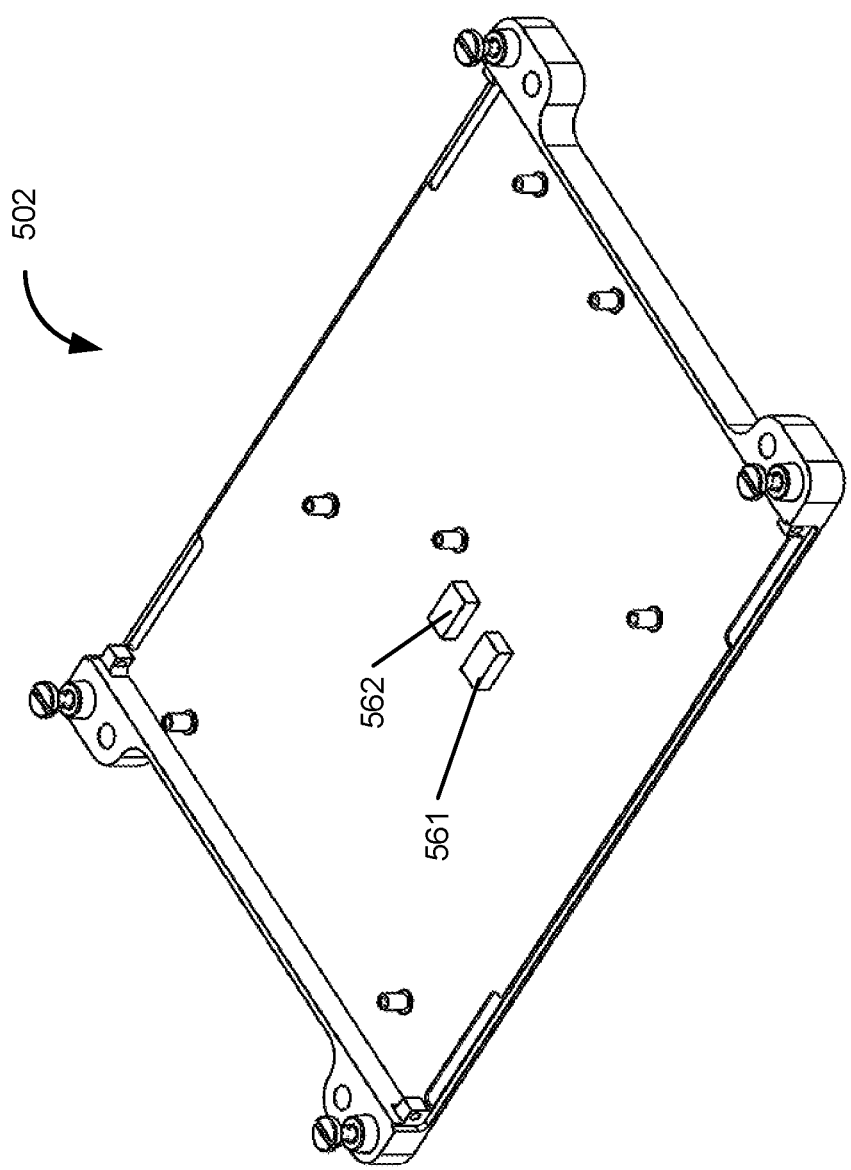
FIG. 9 shows an internal surface of a base plate of a sensor unit according to one embodiment.

FIG. 9 shows an internal surface of a base plate according to one embodiment. Referring to FIG. 9, similar to the heat transfer arms disposed on the internal surface of unit cover 501, one or more heat transfer arms 561-562 may be disposed on the internal surface of base plate 502. The heat transfer arms 561-562 may be utilized to transfer the heat generated from the heat generating components disposed on the bottom of PCB 522 of unit tray 520. When unit tray 520 is deposited onto base plate 502, heat transfer arms 561-562 may substantially contact the external surface of the heat generating components to receive and transfer the heat to base plate 502.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A sensor unit utilized in an autonomous driving vehicle, the sensor unit comprising:
   a unit tray including mounted therein,
       a sensor interface to be coupled to a plurality of sensors mounted on a plurality of locations of an autonomous driving vehicle (ADV),
       a host interface to be coupled to a host system, wherein the host system is configured to perceive a driving environment surrounding the ADV based on sensor data obtained from the sensors and to plan a path to autonomously drive the ADV, and
       one or more sensor processing modules coupled to the sensor interface to process sensor data received from the sensors;
   a unit base plate to receive the unit tray deposited thereon; and
   a unit cover to cover the unit tray and the unit base plate, wherein the unit cover comprises a plurality of fins disposed on an external surface of the unit cover to form a heat sink integrated thereon to radiate heat generated and received from the sensor processing modules without using a fan, wherein the unit cover is made of a heat conductive material.

2. The sensor unit of claim 1, wherein the unit cover further comprises a first set of one or more heat transfer arms disposed on an internal surface of the unit cover, and wherein the heat transfer arms of the first set extend downwardly to receive the heat generated from the sensor processing modules and to transfer the heat to the plurality of fins disposed on the external surface.

3. The sensor unit of claim 2, wherein when the unit cover is lowered down to cover the unit tray, the heat transfer arms are positioned to substantially contact external surfaces of the sensor processing modules to receive and transfer at least a portion of the heat generated by the sensor processing modules.

4. The sensor unit of claim 3, wherein the one or more heat transfer arms are disposed on the internal surface of the unit cover directly underneath at least a portion of the fins disposed on the external surface of the unit cover.

5. The sensor unit of claim 1, wherein the unit base plate further comprises a second set of one or more heat transfer arms disposed on an internal surface of the unit base plate, and wherein the heat transfer arms of the second set extend upwardly to receive the heat generated from the sensor processing modules and to transfer the heat to the base plate.

6. The sensor unit of claim 5, wherein when the unit tray is deposited onto the unit base plate, the heat transfer arms of the second set are positioned to substantially contact external surfaces of the sensor processing modules to receive and transfer at least a portion of the heat generated by the sensor processing modules.

7. The sensor unit of claim 1, wherein the unit tray further comprises:
- a printed circuit board (PCB) having soldered thereon the sensor processing modules and a plurality of sensor connectors as a part of the sensor interface and the host interface;
- a first mounting plate perpendicularly mounted to a first side of the PCB; and
- a second mounting plate perpendicularly mounted to a second side of the PCB, wherein the second side is opposite to the first side.

8. The sensor unit of claim 7, wherein the unit tray is mounted to the unit base plate and the unit cover by mounting the first mounting plate and the second mounting plate onto the unit base plate and the unit cover.

9. The sensor unit of claim 7, wherein the first mounting plate comprises a plurality of openings to expose a first set of sensor connectors as a part of the sensor interface to be connected to a first set of the sensors, and wherein the second mounting plate comprises a plurality of openings to expose a second set of sensor connectors as a part of the sensor interface to be connected to a second set of the sensors.

10. The sensor unit of claim 7, wherein the first mounting plate, the PCB, and the second mounting plate are attached to each other to form a U-shape tray.

11. The sensor unit of claim 10, wherein the unit cover is molded into a single piece in a reversed U-shape form to complement the U-shape tray.

12. The sensor unit of claim 1, wherein the host interface comprises a peripheral component interconnect express (PCIe) interface.

13. The sensor unit of claim 1, wherein the sensor interface comprises an Ethernet interface to be coupled with a LIDAR device or one or more cameras.

14. The sensor unit of claim 1, wherein the sensor interface comprises a global positioning system (GPS) interface to be coupled to at least one of a GPS receiver and an IMU device.

15. The sensor unit of claim 1, wherein the sensor interface comprises a control area network (CAN) interface to be coupled to throttle control logic, braking control logic, and steering control logic of the ADV.

16. An autonomous driving system, comprising:
- a plurality of sensors mounted on a plurality of locations of an autonomous driving vehicle (ADV);
- a host system having a perception module and a planning and control module, wherein the perception module is configured to perceive a driving environment surrounding the ADV based on sensor data obtained from the sensors, and wherein the planning and control module is configured to plan a path to autonomously drive the ADV; and
- a sensor unit coupled to the plurality of sensors and the host system, wherein the sensor unit comprises
  - a unit tray including mounted therein,
    - a sensor interface to be coupled to a plurality of sensors mounted on a plurality of locations of an autonomous driving vehicle (ADV),
    - a host interface to be coupled to the host system, wherein the host system is configured to perceive the driving environment surrounding the ADV based on sensor data obtained from the sensors and to plan the path to autonomously drive the ADV, and
    - one or more sensor processing modules coupled to the sensor interface to process sensor data received from the sensors;
  - a unit base plate to receive the sensor unit tray deposited thereon; and
  - a unit cover to cover the unit tray and the unit base plate, wherein the unit cover comprises a plurality of fins disposed on an external surface of the unit cover to form a heat sink integrated thereon to radiate heat generated and received from the sensor processing modules without using a fan, wherein the unit cover is made of a heat conductive material.

17. The autonomous driving system of claim 16, wherein the unit cover further comprises a first set of one or more heat transfer arms disposed on an internal surface of the unit cover, and wherein the heat transfer arms of the first set extend downwardly to receive the heat generated from the sensor processing modules and to transfer the heat to the plurality of fins disposed on the external surface.

18. The autonomous driving system of claim 17, wherein when the unit cover is lowered down to cover the unit tray, the heat transfer arms are positioned to substantially contact external surfaces of the sensor processing modules to receive and transfer at least a portion of the heat generated by the sensor processing modules.

19. The autonomous driving system of claim 18, wherein the one or more heat transfer arms are disposed on the internal surface of the unit cover directly underneath at least a portion of the fins disposed on the external surface of the unit cover.

20. The autonomous driving system of claim 16, wherein the unit base plate further comprises a second set of one or more heat transfer arms disposed on an internal surface of the unit base plate, and wherein the heat transfer arms of the second set extend upwardly to receive the heat generated from the sensor processing modules and to transfer the heat to the base plate.

* * * * *